US009327911B2

(12) United States Patent
Nozawa

(10) Patent No.: US 9,327,911 B2
(45) Date of Patent: May 3, 2016

(54) BULK FEEDER AND ELECTRONIC COMPONENT MOUNTING DEVICE

(75) Inventor: Mizuho Nozawa, Chiryu (JP)

(73) Assignee: FUJI MACHINE MFG. CO., LTD., Chiryu-shi (JP)

(*) Notice: Subject to any disclaimer, the term of this patent is extended or adjusted under 35 U.S.C. 154(b) by 0 days.

(21) Appl. No.: 14/387,659

(22) PCT Filed: Mar. 28, 2012

(86) PCT No.: PCT/JP2012/058105
§ 371 (c)(1),
(2), (4) Date: Sep. 24, 2014

(87) PCT Pub. No.: WO2013/145145
PCT Pub. Date: Oct. 3, 2013

(65) Prior Publication Data
US 2015/0014122 A1    Jan. 15, 2015

(51) Int. Cl.
*B65G 47/12* (2006.01)
*B65G 15/58* (2006.01)
*H05K 13/02* (2006.01)
*H05K 13/04* (2006.01)

(52) U.S. Cl.
CPC ............... *B65G 47/12* (2013.01); *B65G 15/58* (2013.01); *H05K 13/028* (2013.01); *H05K 13/043* (2013.01)

(58) Field of Classification Search
None
See application file for complete search history.

(56) References Cited

U.S. PATENT DOCUMENTS

| 5,852,869 A | 12/1998 | Gieskes et al. |
| 6,283,272 B1 * | 9/2001 | Hsieh ................ B65G 47/1407 198/394 |
| 6,283,325 B1 | 9/2001 | Saito et al. |
| 6,405,895 B1 * | 6/2002 | Kondo ................ H05K 13/028 198/396 |

(Continued)

FOREIGN PATENT DOCUMENTS

| EP | 0 895 950 A1 | 2/1999 |
| JP | 11-171323 | 6/1999 |
| JP | 2000-22388 | 1/2000 |

(Continued)

OTHER PUBLICATIONS

International Search Report issued May 1, 2012, in PCT/JP12/058105 filed Mar. 28, 2012.

(Continued)

*Primary Examiner* — Kavel Singh
(74) *Attorney, Agent, or Firm* — Oblon, McClelland, Maier & Neustadt, L.L.P.

(57) ABSTRACT

A bulk feeder including a storage section storing multiple electronic components in a loose state and a supply passage guiding the electronic components stored in that storage section to an electronic component supply position while arranged in a single line. The supply path, as well as arranging electronic components stored in the storage section in a single line by relying on magnetic force of permanent magnets, includes a magnetic force dependent supply passage for indexing from the storage section, and an air pressure dependent supply passage indexing electronic components indexed from the magnetic force dependent supply passage to the supply position by relying on positive pressure or negative pressure air blown from air passages. By combining the appropriate advantages of magnetic force and air pressure respectively, it is possible to perform supply of electronic components ideally and practicality of the bulk feeder is improved.

10 Claims, 11 Drawing Sheets

(56) References Cited

U.S. PATENT DOCUMENTS

| | | | | |
|---|---|---|---|---|
| 6,471,094 | B2 * | 10/2002 | Saito | H05K 13/028 221/210 |
| 2006/0254048 | A1 * | 11/2006 | Shimada | B65G 47/1407 29/740 |

FOREIGN PATENT DOCUMENTS

| JP | 2000-277983 | 10/2000 |
|---|---|---|
| JP | 2001-287826 | 10/2001 |
| JP | 2001-287827 | 10/2001 |
| JP | 2006-120676 | 5/2006 |
| JP | 2008-270332 | 11/2008 |
| JP | 2009-105363 | 5/2009 |
| JP | 2009-266895 | 11/2009 |

OTHER PUBLICATIONS

Extended European Search Report issued in European Patent Application No. 12872644.5 on Dec. 4, 2015.

* cited by examiner

BULK FEEDER AND ELECTRONIC COMPONENT MOUNTING DEVICE

TECHNICAL FIELD

The present disclosure relates to a bulk feeder for supplying electronic components to a supply position which indexes multiple electronic components which are stored in a loose state to a supply position while arranged in a single line, and an electronic component mounter module equipped with that bulk feeder.

BACKGROUND ART

Bulk feeders are usually configured to supply electronic components to a supply position, and are equipped with a storage section for storing multiple electronic components in a loose state, and a supply passage for guiding the electronic components stored in that storage section to an electronic component supply position while arranged in a single line. Bulk feeders given in the patent literature below are an example of feeders configured in that way, and are configured to index electronic components to a supply position while arranging the electronic components in the supply passage by relying on compressed air or the weight of the electronic components.

Patent Literature 1: Japanese Unexamined Patent Application Publication Number 2000-22388
Patent Literature 2: Japanese Unexamined Patent Application Publication Number 2006-120676

SUMMARY OF INVENTION

Problem to be Solved by the Invention

Using the bulk feeders according to the above patent literature, indexing multiple electronic components which are stored in a loose state to a supply position while arranged inside a supply passage is possible to a certain extent. However, arranging electronic components which are stored in a loose state inside a supply passage by relying on compressed air is comparatively difficult. Also, arranging multiple electronic components which are stored in a loose state inside a supply passage and indexing them to a supply position by relying on the weight of the electronic components requires that the supply position is provided below the electronic component storage section, which limits items such as the position in which the supply passage is formed and the supply position. In this way, there remains considerable scope for improving bulk feeders, and by performing various improvements the practicality of bulk feeders can be increased. The present disclosure describes an item which takes account of such circumstances and relates to a highly practical bulk feeder and electronic component mounter module equipped with that bulk feeder.

Means for Solving the Problem

In order to solve the above problems, the bulk feeder according to one embodiment comprises: a storage section for storing multiple electronic components in a loose state and a supply passage for guiding the electronic components stored in that storage section to an electronic component supply position while arranged in a single line and is a bulk feeder for supplying electronic components to the supply position; wherein the supply passage, as well as arranging electronic components stored in the storage section in a single line by relying on magnetic force, has a magnetic force dependent supply passage for indexing from the storage section, and an air pressure dependent supply passage which is connected to the magnetic force dependent supply passage for indexing electronic components indexed from the magnetic force dependent supply passage to the supply position by relying on positive pressure or negative pressure air.

The bulk feeder according to another embodiment comprises: a magnetic force dependent indexing device which uses a magnet and by the movement of that magnet indexes electronic components from the storage section to the air pressure dependent supply passage via the magnetic force dependent supply passage, an air pressure dependent indexing device which is connected to the air pressure dependent supply passage and which indexes electronic components to the supply position by supplying positive pressure or negative pressure air to the air pressure dependent supply passage, and a control device for controlling the magnetic force dependent indexing device and air pressure dependent indexing device; wherein the control device can selectively perform electronic component intermittent supply control in which electronic components are indexed to the supply position by operating the magnetic force dependent indexing device while intermittently operating the air pressure dependent indexing device, and electronic component continuous supply control in which electronic components are indexed to the supply position by continuously operating the air pressure dependent indexing device without operating the magnetic force dependent indexing device.

The bulk feeder according to another embodiment is fixedly connected to a mounting head for mounting electronic components supplied by the feeder to a circuit board, and is capable of being moved by a moving device to any position above a base together with the mounting head, wherein the control device can selectively perform the electronic component intermittent supply control and the electronic component continuous supply control in accordance with the movement distance of the moving device.

In the bulk feeder according to another embodiment, the control device performs the electronic component intermittent supply control when it is assumed that there are insufficient electronic components in the air pressure dependent supply passage.

The bulk feeder according to another embodiment comprises a detection sensor for detecting the presence of electronic components equipped on the air pressure dependent supply passage, wherein the control device, based on the detection value of the detection sensor, performs the electronic component intermittent supply control when it is assumed that there are insufficient electronic components in the air pressure dependent supply passage.

In the bulk feeder according to another embodiment, the control device, based on the quantity of electronic components which are capable of being stored in the air pressure dependent supply passage and the quantity of electronic components being supplied by the electronic component continuous supply control, performs the electronic component intermittent supply control when it is assumed that there are insufficient electronic components in the air pressure dependent supply passage.

An embodiment of an electronic component mounter module comprises: one of the bulk feeders described above, an electronic component supply device different to that bulk feeder, and a mounting head for mounting electronic components supplied by the bulk feeder or the electronic component supply device to a circuit board; wherein the mounting head mounts on a circuit board electronic components supplied by the electronic component supply device while electronic component intermittent supply control is being performed.

SUMMARY OF INVENTION

With the bulk feeder according to one embodiment, multiple electronic components stored in a loose state are arranged in a supply passage using magnetic force. The electronic components arranged in the supply passage are indexed to a supply position using air pressure. It is difficult to arrange multiple electronic components housed in a loose state in a supply passage using air pressure, but it is possible to perform this relatively easily if magnetic force is used. On the other hand, it is possible to perform indexing of multiple electronic components arranged in a supply passage using magnetic force, but using air pressure makes it possible to index electronic components at a faster speed. Also, by indexing electronic components to a supply position using air pressure, it is possible to design items such as a supply passage and supply position relatively freely. In this way, with the bulk feeder according to one embodiment, by combining the appropriate advantages of magnetic force and air pressure respectively, it is possible to perform supply of electronic components ideally and the practicality of the bulk feeder is improved.

Also, in another embodiment of the bulk feeder while indexing electronic components to a supply position intermittently, electronic component intermittent supply control (hereafter in some cases abbreviated to "intermittent supply control") to replenish new electronic components in the supply passage and electronic component continuous supply control (hereafter in some cases abbreviated to "continuous supply control") to index electronic components continuously to a supply position can selectively be performed. With continuous supply control, because electronic components are capable of being supplied continuously, mounting operation can be performed efficiently. However, there is a concern about an insufficiency of electronic components which should be supplied due to electronic components not being replenished in the supply passage. On the other hand, although intermittent supply control can only supply electronic components intermittently, it is capable of replenishing electronic components in the supply passage. Due to this, in accordance with each circumstance, by selectively performing intermittent supply control and continuous supply control, supply of electronic components which makes use of the advantages of each control type is capable of being performed.

Also, the bulk feeder according to another embodiment is fixedly connected to a mounting head which performs electronic component mounting operation, and is capable of being moved by a moving device to any position above the base together with the mounting head. Also, continuous supply control and intermittent supply control are performed selectively in accordance with the moving distance of the moving device. Because electronic components are mounted in various locations on a circuit board, the moving distance of the mounting head between two consecutive mounting operation mounting positions differs for each mounting operation. Due to this, the time required to move the mounting head between two consecutive mounting operation mounting positions also differs, and the quantity of electronic components which should be supplied per unit time differs.

In light of this, if the moving distance of the moving device is short, in other words if the time required to move the mounting head is short, it is desirable to perform mounting operation efficiently by performing continuous supply control. On the other hand, if the moving distance of the moving device is long, in other words the time required to move the mounting head is long, it is desirable, by performing intermittent supply control, to make use of the long moving time and perform replenishment of electronic components in the supply passage while supplying electronic components. In this way, by selectively performing continuous supply control and intermittent supply control in accordance with the moving distance of the moving device, it is possible to prevent an insufficiency of electronic components in the supply passage together with performing mounting operation efficiently.

Also, in the bulk feeder according to another embodiment, when it is assumed that there is an insufficiency of electronic components which should be supplied, intermittent supply control is performed. By this, it is possible to reliably prevent an insufficiency of electronic components which should be supplied.

In the bulk feeder according to another embodiment, a detection sensor for detecting the presence of electronic components is provided in the supply passage, and an insufficiency of electronic components which should be supplied is assumed based on the detection value of that detection sensor. By this, it is possible to make appropriate assumptions of an insufficiency of electronic components which should be supplied.

In the bulk feeder according to another embodiment, an insufficiency of electronic components which should be supplied is assumed based on the quantity of electronic components which are capable of being stored in the supply passage and the quantity of electronic components supplied by continuous supply control. In other words, by subtracting the quantity of electronic components being supplied by continuous supply control from the quantity of electronic components which are capable of being stored in the supply passage, it is possible to know the quantity of electronic components remaining in the supply passage. By this, it is possible to make appropriate assumptions of an insufficiency of electronic components which should be supplied.

In one embodiment of the electronic component mounter module, when intermittent supply control is being performed, electronic components supplied by an electronic component supply device different to a bulk feeder are mounted on a circuit board by the mounting head. By this, it is possible to curtail the drop in productivity when the supply quantity of electronic components per unit time is lowered.

DESCRIPTION OF PREFERRED EMBODIMENTS

The following describes in detail referring to the figures an example embodiment for the present disclosure.

Electronic component mounter machine configuration

Figure 1:
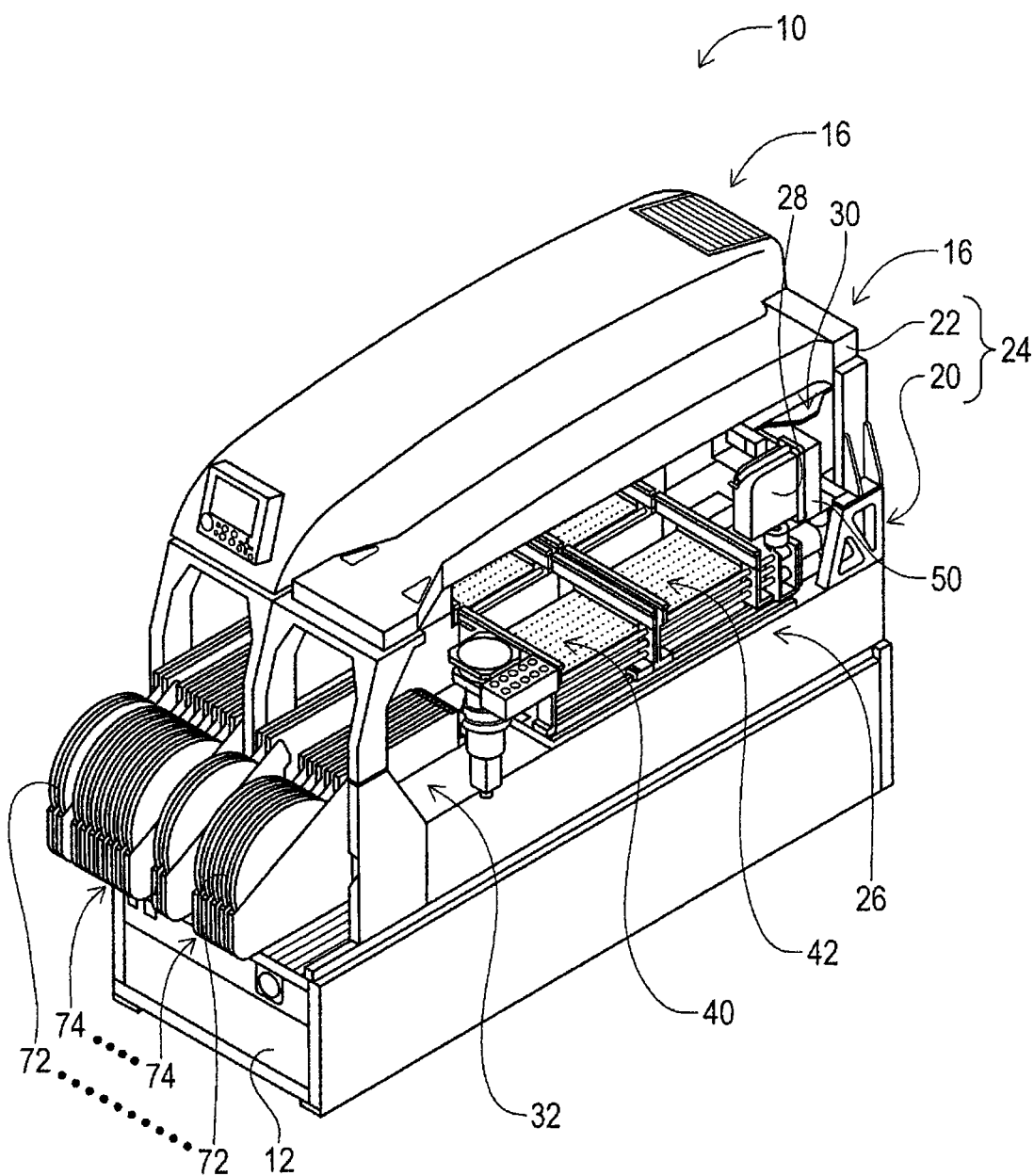
[FIG. 1] This is a perspective view showing the electronic component mounter machine with bulk feeder loaded which is an embodiment of the present invention.

Electronic component mounter machine (hereafter in some cases abbreviated to "mounter machine") 10 is shown in FIG. 1. That figure is a perspective view with some sections of the external parts of mounter machine 10 omitted. Mounter machine 10 is configured to include one system base 12 and two electronic component mounter modules (hereafter in some cases abbreviated to "mounter module") 16 arranged lined up side by side adjacent to each other on that system base 12, and is used to perform the mounting operation of electronic components on a circuit board. For the description below, the direction in which mounter modules 16 are lined up side by side is referred to as the X-axis direction and the horizontal direction perpendicular to that direction is the Y-axis direction.

Each mounter module 16 equipped on mounter machine 10 comprises, mainly, mounter module main body 24 configured to include frame 20 and beam 22 mounted above that frame 20; conveyance device 26 for conveying circuit boards in the X-axis direction as well as securing them in a specified position; mounting head 28 for performing mounting operation on the circuit board secured by the conveyance device 26; moving device 30 for moving mounting head 28 attached to beam 22 in the X-axis direction and Y-axis direction; and electronic component supply device (hereafter in some cases abbreviated to "supply device") 32 for supplying electronic components positioned at the front of frame 20.

Conveyance device 26 comprises two conveyor devices 40 and 42 and those two conveyor devices 40 and 42 are positioned in the center of the Y-axis direction of frame 20 so that they are parallel to each other and extend in the X-axis direction. Each of the two conveyor devices 40 and 42, as well as conveying circuit boards held by conveyor devices 40 and 42 in the X-axis direction using electromagnetic motor (refer to FIG. 10) 46, are configured to hold circuit boards securely in a specified position by board holding device (refer to FIG. 10) 48.

Moving device 30 is an XY robot type moving device, and comprises an electromagnetic motor (refer to FIG. 10) 52 for sliding slider 50 which holds mounting head 28 in the X-axis direction; and an electromagnetic motor (refer to FIG. 10) 54 for sliding in the Y-axis direction; by operating these 2 electromagnetic motors 52 and 54, it is possible to move mounting head 28 to any position on frame 20.

Supply device 32 is positioned on the front end of frame 20 and is a feeder type supply device. Supply device 32 has multiple tape feeders 74 which house taped components which are electronic components that have been taped which are in a wound state on reels 72, and multiple indexing devices (refer to FIG. 10) 76 which index taped components which are housed in each of those multiple tape feeders 74, and is configured to supply consecutively electronic components from taped components to the supply position.

Figure 2:
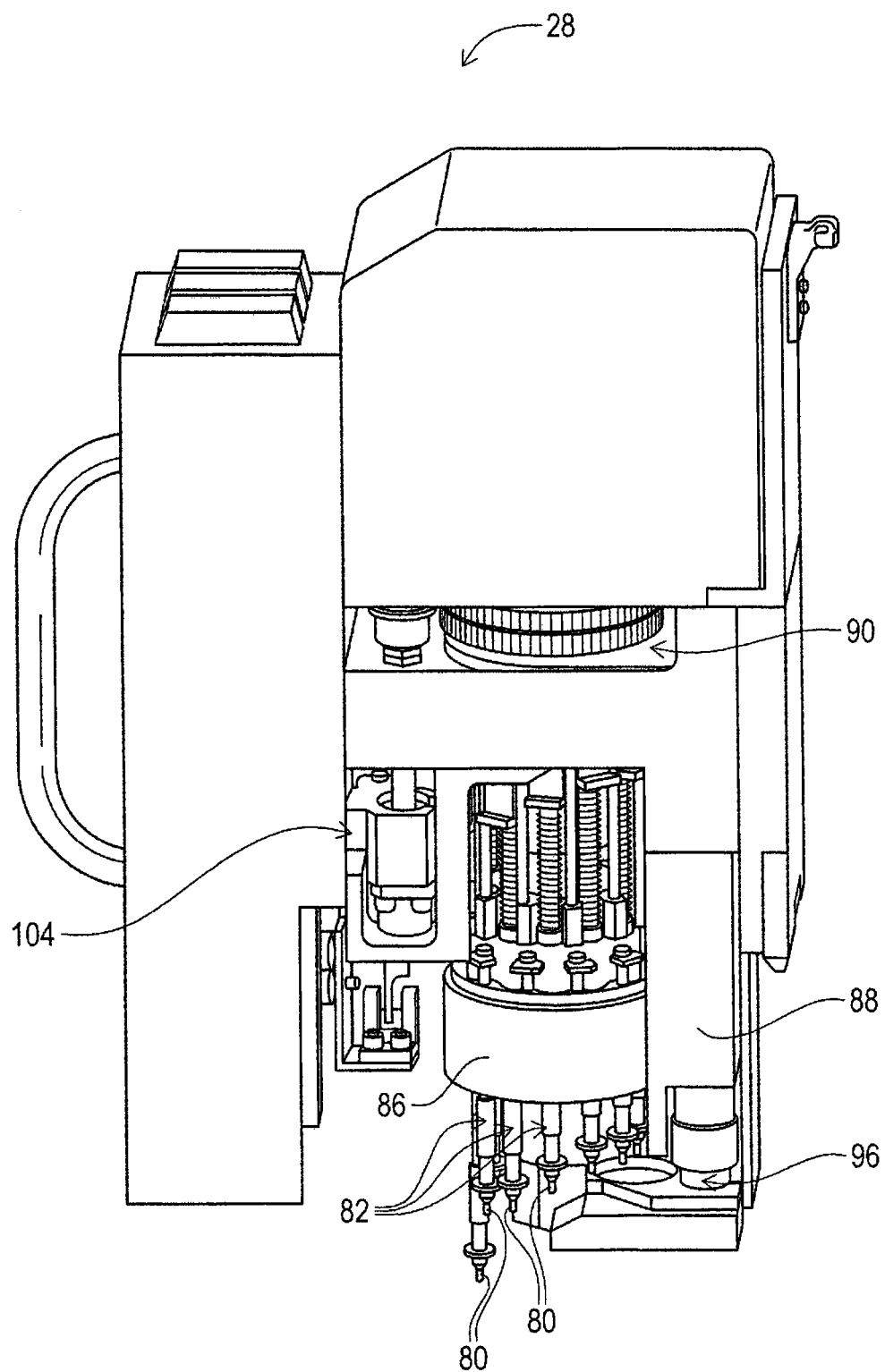
[FIG. 2] This is a perspective view showing a mounting head which is provided on the electronic component mounter machine.
Figure 3:
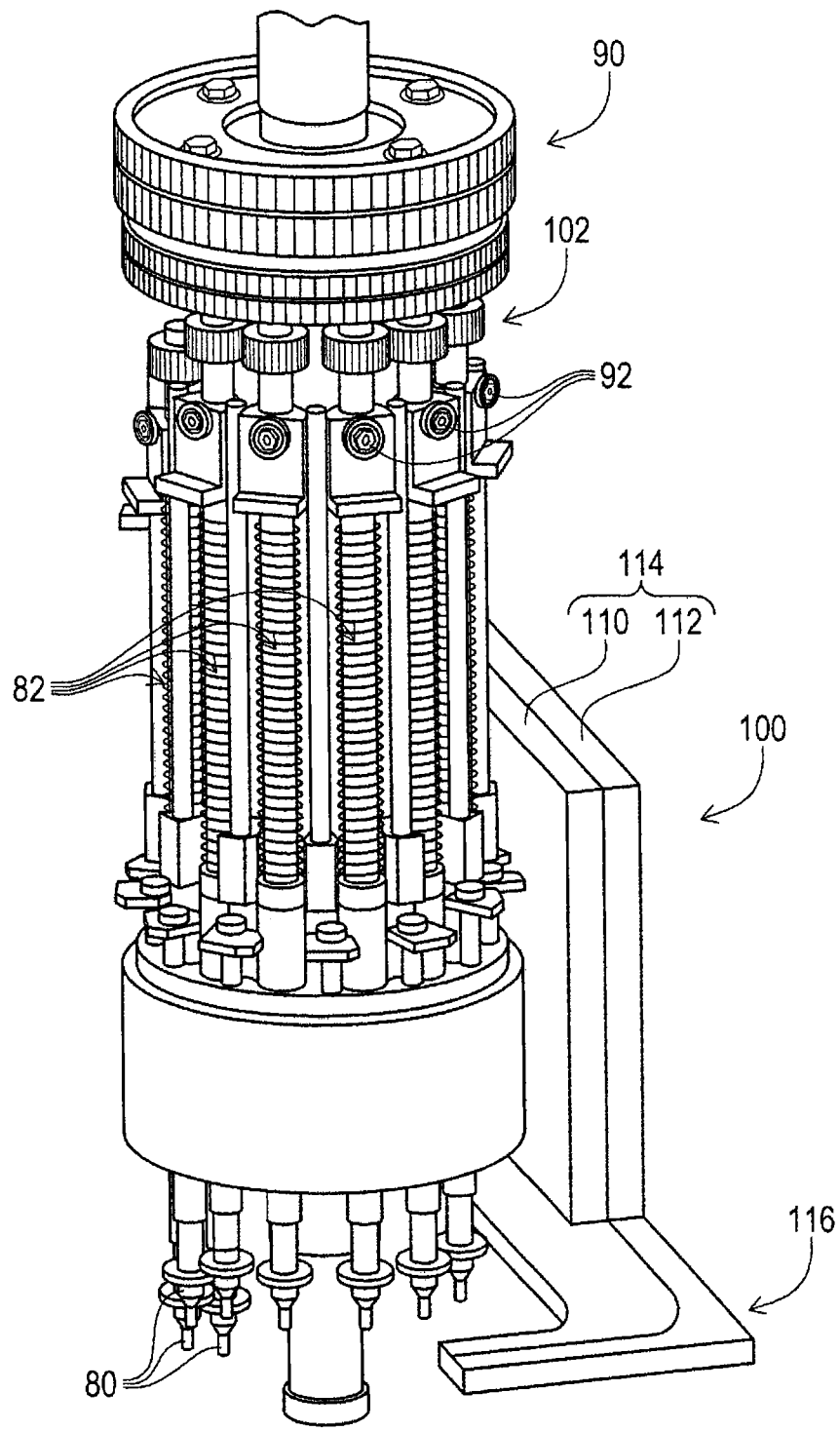
[FIG. 3] This is a perspective view showing the mounting head and the bulk feeder attached to that mounting head.
Figure 4:
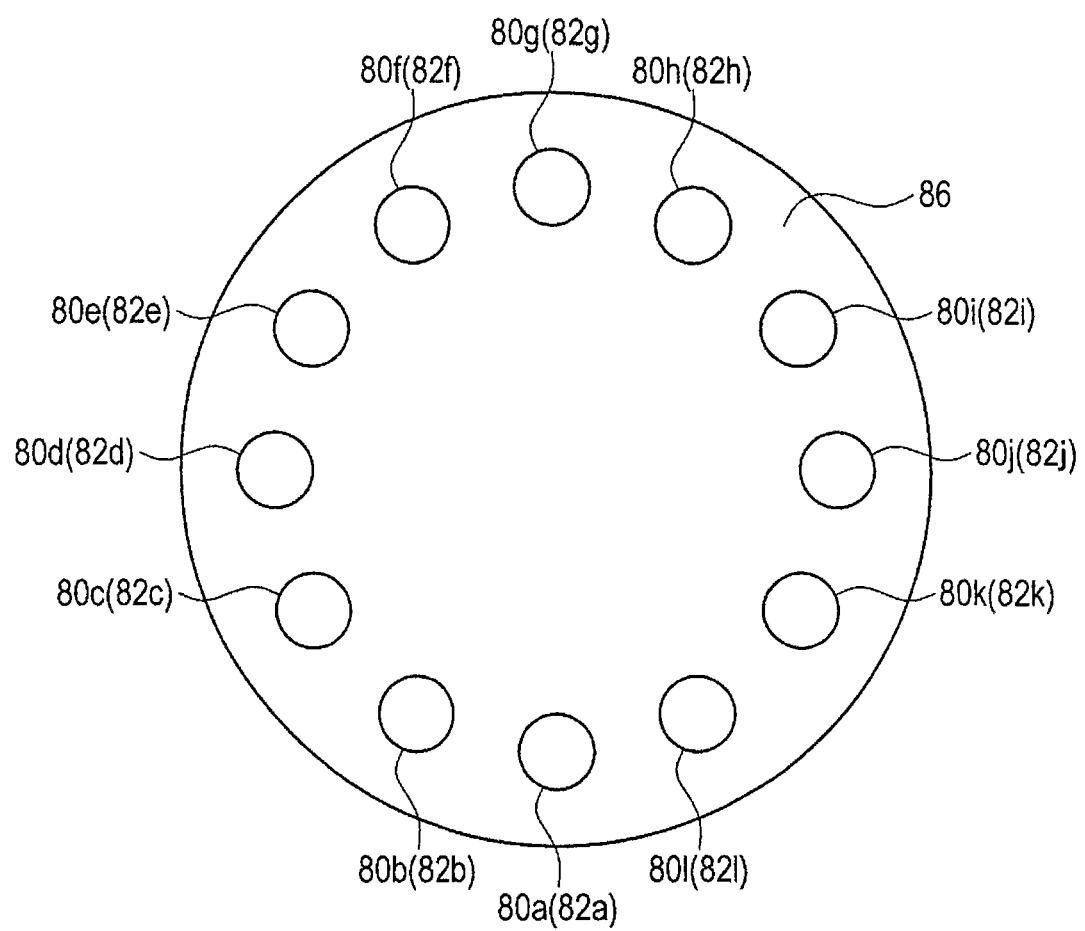
[FIG. 4] This is a bottom view showing the mounting head as seen from below.

Also, mounting head 28 is for mounting electronic components on a circuit board held by conveyor device 26, and, as shown in FIGS. 2 to 4, is equipped with twelve attachment units 82 for holding at the tip suction nozzles 80 for picking up electronic components. Also, FIG. 2 is a perspective view showing mounting head 28 in a state removed from slider 50, and FIG. 3 is a perspective view showing mounting head 28 in a state with the covers removed. Also, FIG. 4 is a bottom view of mounting head 28 showing mounting head 28 as seen from below.

Suction nozzles 80 are each configured, through positive and negative pressure supply device (refer to FIG. 10) 84 and via negative pressure air and positive pressure air paths, to hold by suction electronic components using negative pressure, and release the electronic components being held by a small amount of positive pressure being supplied. Attachment units 82 which generally take the form of shafts are held in a state so that the axis direction is vertical at a pitch of equal angles on the outer circumference section of unit holding body 86 which rotates intermittently, and suction nozzles 80, as shown in FIG. 4, extend in twelve equally distributed positions in the downward direction from the bottom surface of unit holding body 86.

Unit holding body 86 is supported by head body 88 of mounting head 28 so that it is capable of being rotated about a vertical axis line of itself, and is intermittently rotated at equal angle increments at the arrangement angle pitch of attachment 82 by holding body rotation device 90. By this, attachment units 82 held on unit holding body 86 are intermittently rotated.

Rollers 92 are equipped to function as a cam follower at the top section of each attachment unit 82, and each roller 92 is engaged with the cam surface of the cam (omitted from figure) fixed to head body 88. This cam surface is configured so that the height in the circumference varies. Also, each attachment unit 82 is held on unit holding body 86 so that it is capable of moving up and down. By this, attachment units 82 move up and down based on the intermittent rotation of unit holding body 86.

In detail, attachment unit 82 located at the mounting station (the station located furthest to the front) which is the stopping position furthest from head body 88 among the multiple stopping positions of the intermittent rotation of attachment units 82 moves furthest down. In other words, when mounting head 28 is moved above a circuit board, the distance between suction nozzle 80 of attachment unit 82 located at that station and the circuit board is at its shortest, and an electronic component is mounted on the circuit board by suction nozzle 80 of that mounting station.

Also, the station positioned directly opposite across the axis center of unit holding body 86 of that mounting station, in other words, the attachment unit 82 located at the imaging station (the station located furthest to the rear) which is the stopping position closest to head body 88, and the four attachment units 82 which are located two each on either side to the left and right of that attachment unit 82, move furthest up. In other words, five attachment units 82 centered around attachment unit 82 located at the imaging station move furthest up.

Head body 88, as shown in FIG. 2, extends lower than the bottom tip of suction nozzle 80 of each attachment unit 82 which is located furthest up and protrudes on the suction nozzle 80 side. Parts camera 96 is arranged on that portion which is protruded, and an image is captured by parts camera 96 of the electronic component being held on suction nozzle 80 of attachment unit 82 located at the imaging station. Also, on the lower surface of the portion on which parts camera 96 is arranged, mark camera (refer to FIG. 10) 98 is arranged in a state facing down, and by being moved by moving device 30, images are capable of being captured at any position on frame 20.

Here, the positional relationship of each station is described using FIG. 4. When attachment unit 82a, which is one out of the twelve attachment units 82a to 82l, is located at the mounting station, (i.e., when attachment unit 82a is moved furthest down), five attachment units 82e to 82i are moved furthest up and attachment unit 82g is located at the imaging station. Further, when unit holding body 86 rotates in the normal direction, unit holding body 86 rotates in the clockwise direction in FIG. 4.

Also, the station at which attachment unit 82e which of the five attachment units 82e to 82i is furthest downstream in the rotation direction of unit holding body 86 is located, is the pickup station for picking up electronic components supplied from bulk feeder (refer to FIG. 3) 100 which is described in detail later. Further, electronic components supplied from tape feeders 74 are picked up by attachment unit 82a located at the mounting station.

Also, mounting head 28 has unit rotating devices 102 for rotating each attachment unit 82 about its own center axis respectively, and the holding orientation of electronic components being held by suction is capable of being changed by each attachment unit 82. Also, mounting head 28 is provided with unit raising and lowering devices 104 for raising and lowering individually attachment units 82 which are located at the mounting station and pickup station, and attachment units 82 are moved to any position in the vertical direction when electronic components are mounted and picked up.

Figure 5:
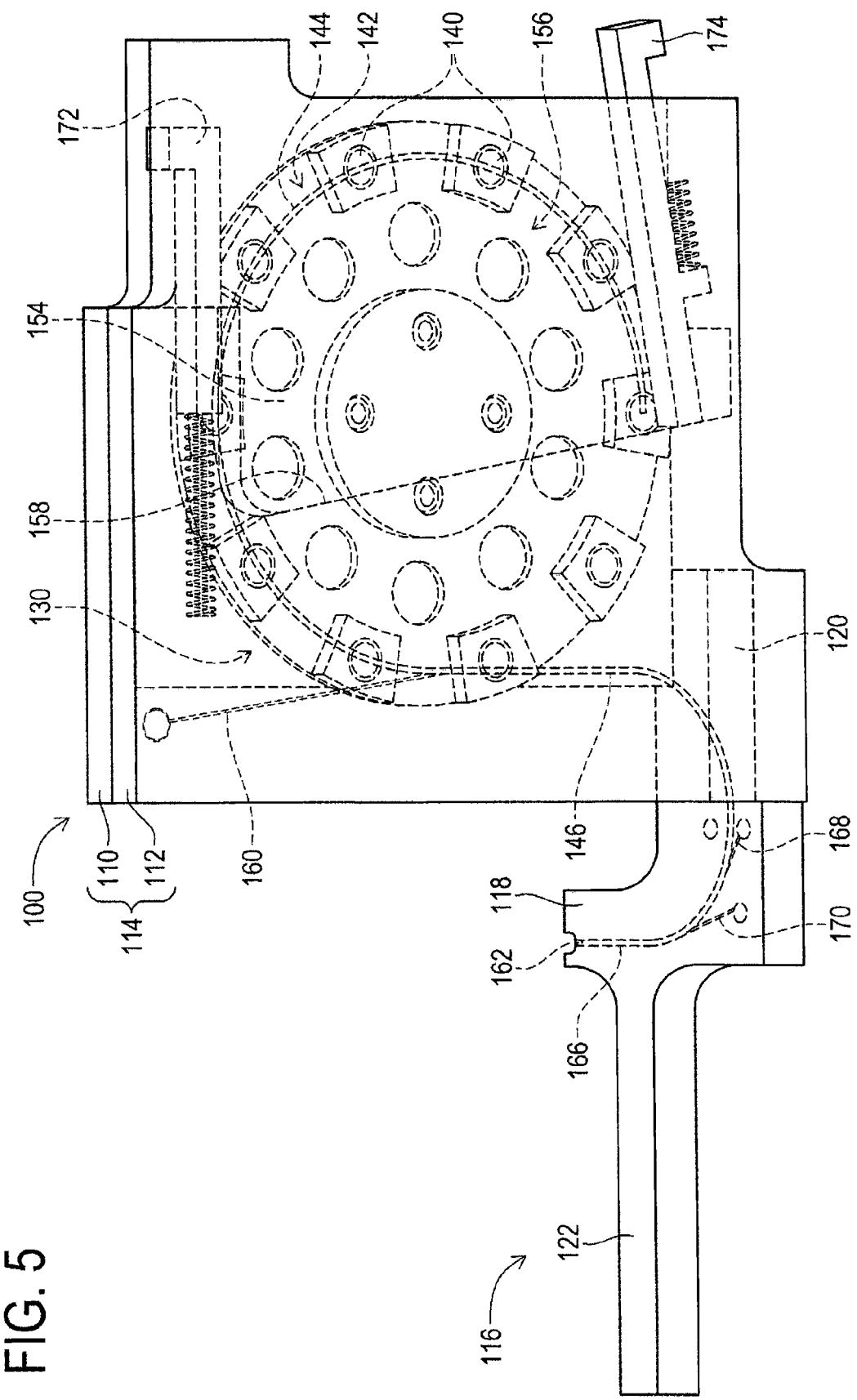
[FIG. 5] This is a perspective view showing the bulk feeder.
Figure 6:
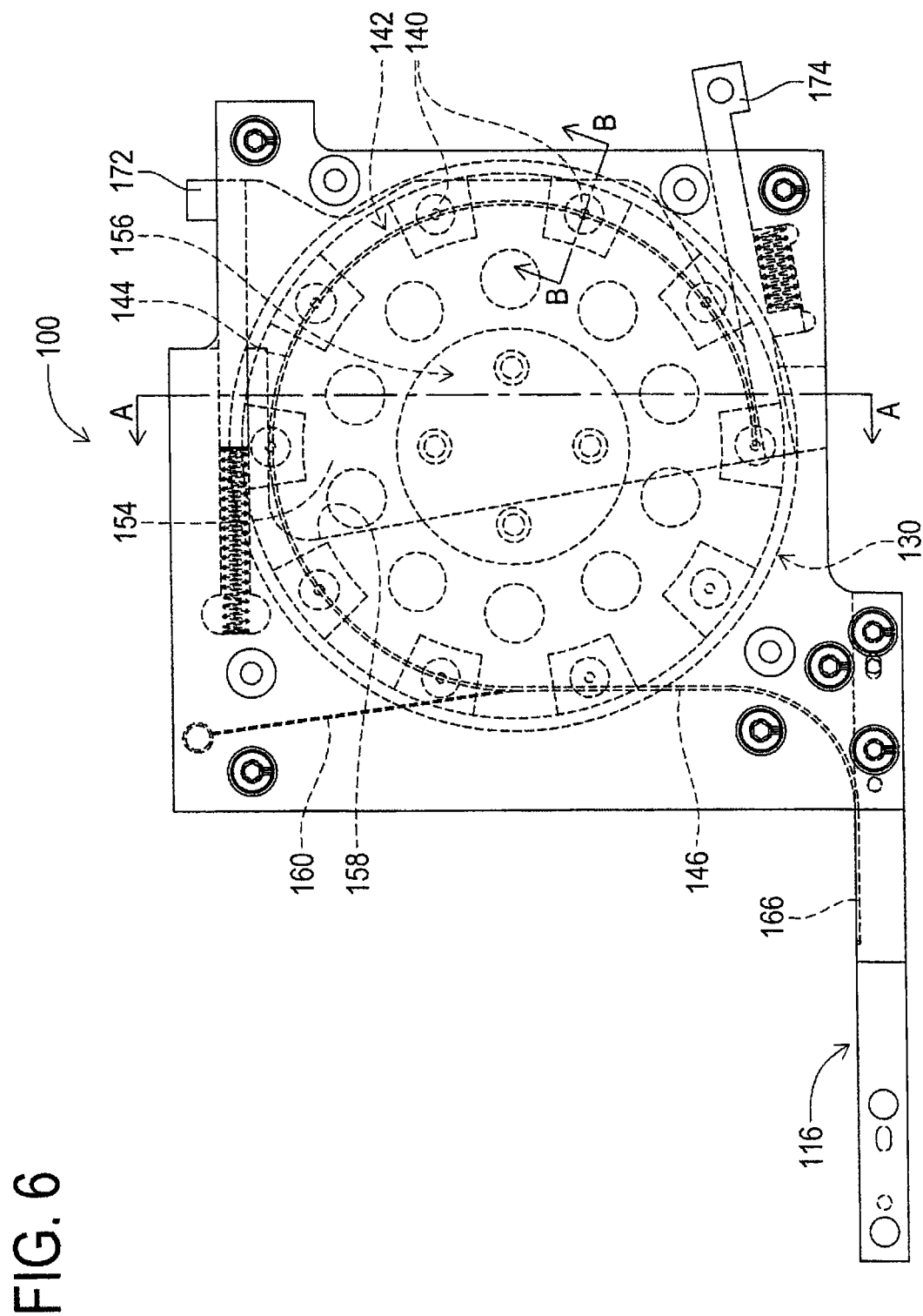
[FIG. 6] This is a side view showing the bulk feeder.
Figure 7:
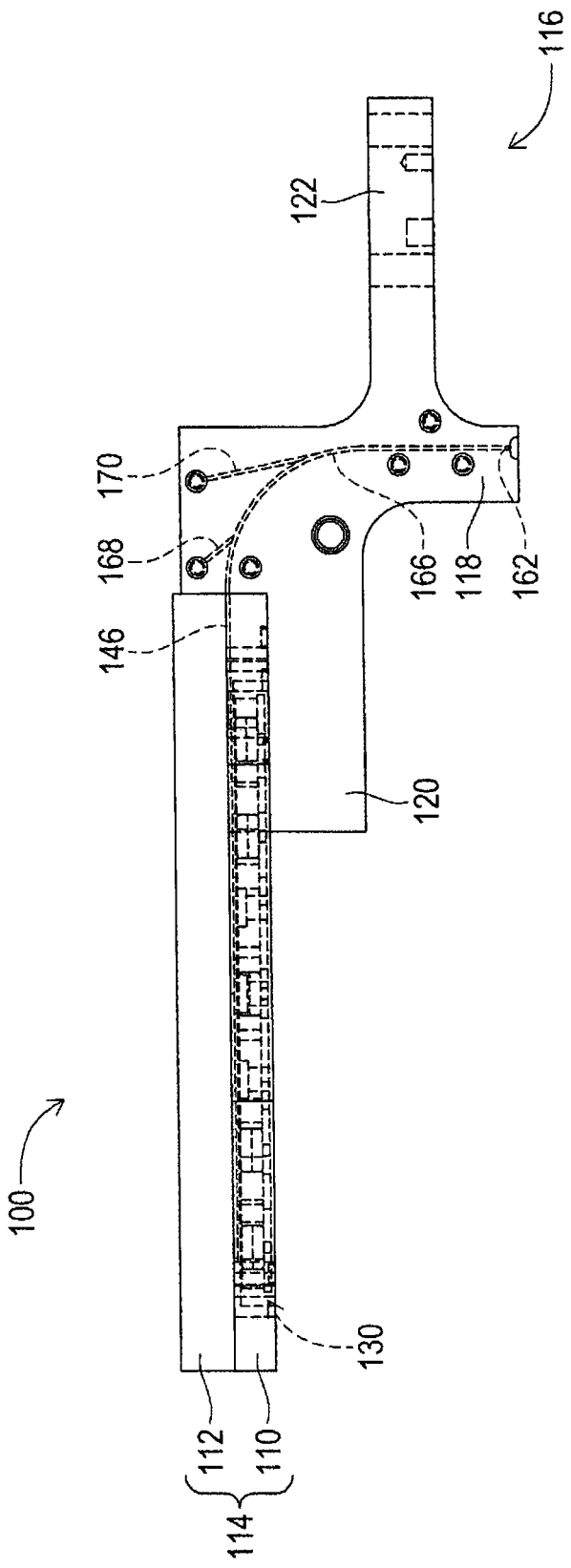
[FIG. 7] This is a front view showing the bulk feeder as seen from above.
Figure 8:
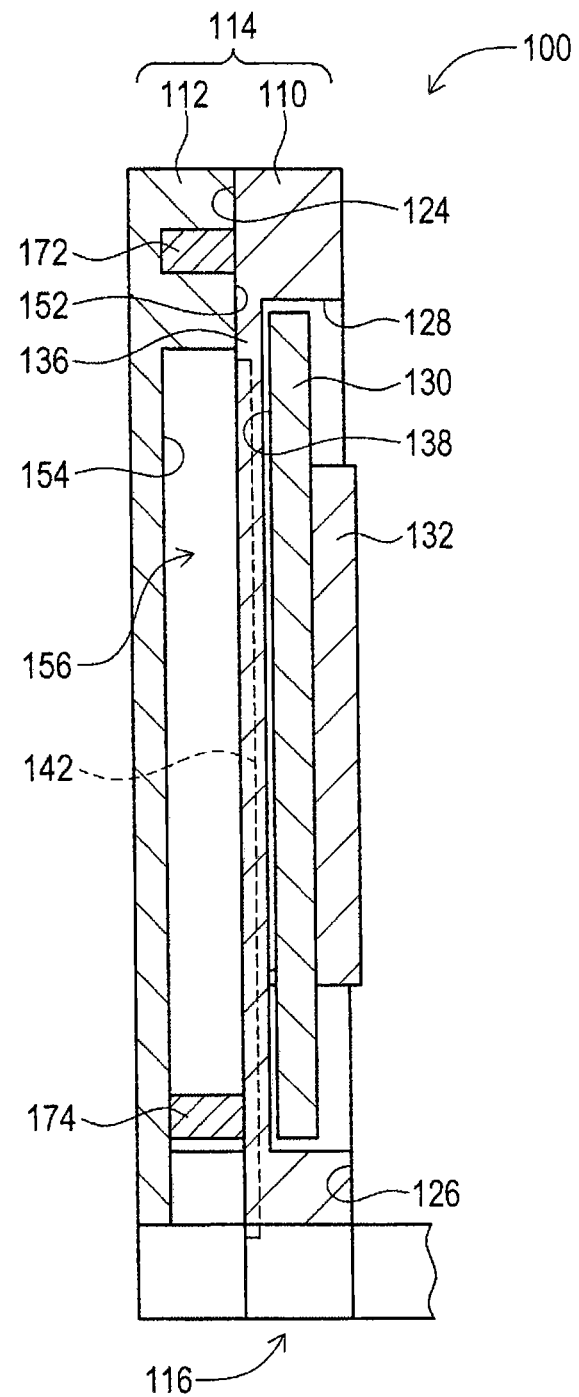
[FIG. 8] This is a cross section of line AA shown in FIG. 6.
Figure 9:
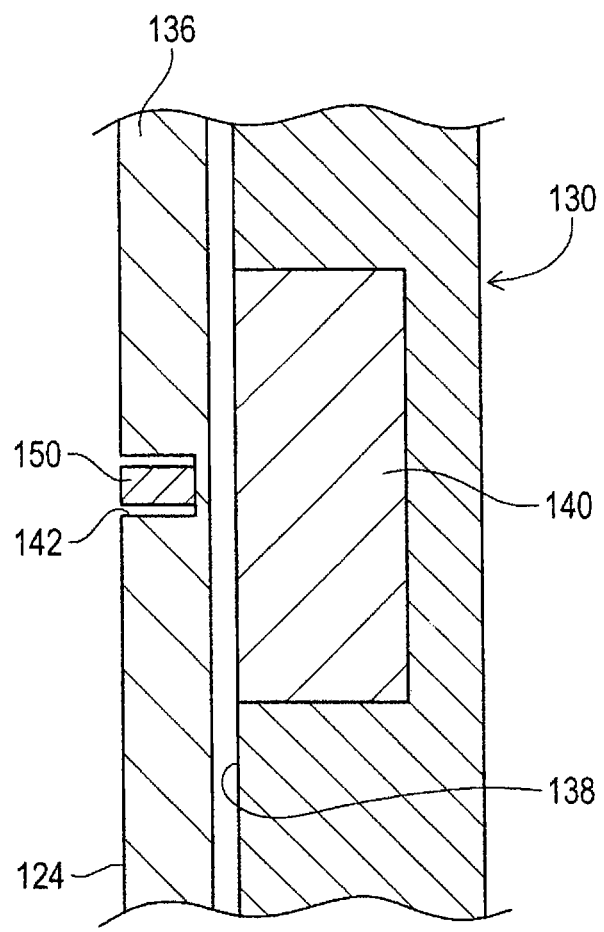
[FIG. 9] This is a cross section of line BB shown in FIG. 6.

Here, bulk feeder 100 for supplying electronic components to attachment unit 82 located at the pickup station is described using FIG. 5 to FIG. 9. Also, FIG. 5 is a perspective view of bulk feeder 100, FIG. 6 is a side view, and FIG. 7 is a front view showing bulk feeder 100 as seen from above. Also, FIG. 8 is a cross section of line AA shown in FIG. 6, and FIG. 9 is a cross section of line BB shown in FIG. 6.

Bulk feeder 100 is attached to head body 88 of mounting head 28 and is capable of being moved to any position on frame 20 along with mounting head 28 by moving device 30. Bulk feeder 100 has housing 114 which is two case members 110 and 112 fitted reciprocally together, and arm member 116 fastened by bolts to head body 88 and secured to the bottom end of housing 114.

Arm member 116 is divided into first arm section 118 which reaches lower than attachment unit 82 located at the pickup station, second arm section 120 which is orthogonal while being in the same horizontal plane as first arm section 118, and third arm section 122 which is orthogonal while being in the same horizontal plane as first arm section 118 and which extends in the opposite direction to second arm section 120. Arm member 116 is fastened by bolts to head body 88 at third arm section 122, and is fastened by bolts to housing 114 at second arm section 120.

The two case members 110 and 112 which make up housing 114 are tabular plates and are established in a state with their respective surfaces fitted together. As shown in FIG. 8, fitting surface 124 to which case member 112 is fitted and recess section 128 which opens in surface 126 on the opposite side are formed on case member 110, and turntable 130 is provided inside that recess section 128.

Turntable 130 is disc shaped and is held on case member 110 such that it is capable of being rotated around its center axis. Rotation movement device 132 is provided on turntable 130 and turntable 130 is controllably rotated by the movement of electromagnetic motor (refer to FIG. 10) 134 of rotation movement device 132. Further, when turntable 130 is rotated in the normal direction, turntable 130 shown in FIG. 6 rotates in the counterclockwise direction.

As shown in FIG. 9, permanent magnet 140 is embedded in the opposite surface 138 of turntable 130 facing base section 136 of recess section 128 formed in case member 110. As shown in FIG. 6, ten permanent magnets 140 are embedded near the outer edge section of turntable 130, and the ten permanent magnets 140 are positioned evenly.

Also, on base section 136 of recess section 128, groove 142 is formed in fitting surface 124 which is the surface on the opposite side and the surface facing turntable 130. As shown in FIG. 6, groove 142 is divided into annular groove section 144 which is a portion that is annular with the rotational axis line of turntable 130 as its center and vertical groove section 146 which is connected to that annular groove section 144 and extends generally in the vertical direction.

Annular groove section 144 is formed in the position following the rotation path of the ten permanent magnets 140 based on the rotation of turntable 130, and extends in the rotation direction of the normal rotation of turntable 130 from the lowest point of the rotation path of permanent magnets 140, via the highest point of the rotation path of permanent magnets 140, and arrives at the foremost end (the end point on the side of arm member 116). On the other hand, vertical groove section 146 connects on from the foremost end extending down of annular groove section 144 and extends down. And, it is curved to the front (in the direction towards arm member 116), and open to the side surface of the front of case member 110 in a state which is generally horizontal.

Inside groove 142, as well as electronic components being housed while the longitudinal direction thereof extends in the longitudinal direction of groove 142, multiple electronic components are housed in a state arranged in a single line in the longitudinal direction of each thereof. As shown in FIG. 9, the depth of groove 142 is slightly larger than the width of electronic component 150, and the width of groove 142 is slightly larger than the thickness of electronic component 150. And, electronic components 150 are housed in groove 142 so that the thickness direction is in the width direction of groove 142.

Also, on case member 112, as shown in FIG. 8, recess section 154 which opens and is formed in fitting surface 152 which is fitted to fitting surface 124 in which groove 142 is formed. In detail, recess section 154, as shown in FIG. 6, is generally semicircular and is formed in a state extending backwards from a section of the rotational axis line of turntable 130 and annular groove section 144, specifically, the lowest point of annular groove section 144, and covering the portion reaching the highest point. Further, two case members 110 and 112 are fitted together by respective fitting surfaces 124 and 152, and electronic component storage section 156 is formed by the opening of the recess section 154 being blocked by base section 136. In other words, storage section 156 is bounded by recess section 154 of case member 112 and base section 136 of case member 110.

The portion covered by recess section 154 of annular groove section 144 is open to the inside of recess section 154, in other words, storage section 156. Also, annular groove section 144, as given above, is formed along the rotation path of permanent magnets 140. Due to this, electronic components housed in storage section 156 are taken into annular groove section 144 by the magnetic force of permanent magnets 140. Further, by rotating turntable 130 in the normal direction via the movement of rotation movement device 132, electronic components taken into annular groove section 144 are moved in the rotational direction of turntable 130.

However, the portion not covered by recess section 154 of annular groove section 144 is blocked by fitting surface 152 of case member 112, so that the cross section is a rectangular tunnel. Due to this, when electronic components housed in annular groove section 144 reach the tunnel shaped annular groove section 144 in accordance with the rotation of turntable 130, electronic components which protrude from annular groove section 144 are prevented from entering into tunnel shaped annular groove section 144 by side wall 158 of recess section 154.

Specifically, side wall 158 which is located at the diameter section of semicircular recess section 154 is established perpendicular with respect to fitting surface 124 formed in groove 142, and the upper end section of side wall 158 is located near the highest point of annular groove section 144. And, annular groove section 144 located upstream of side wall 158 opens onto storage section 156, and annular groove section 144 located downstream of side wall 158 is tunnel shaped. Due to this, electronic components protruding from annular groove section 144 contact side wall 158 near the highest point of annular groove section 144 and are prevented from being indexed from storage section 156. By this, it is possible to only index from storage section 156 electronic components which are appropriately housed in annular groove section 144. Further, case member 112 is formed out of semi-transparent material so that items such as storage section 156 and annular groove section 144 can be checked visually from outside.

Also, air groove 160 for supplying air is formed in fitting surface 124 which is formed in groove 142 formed from annular groove section 144 and vertical groove section 146. This air groove 160 is formed to extend in the vertical direction, and the lowest section thereof is connected to the boundary portion of annular groove section 144 and vertical groove section 146. Air groove 160, at the uppermost section, is linked to an air passage (omitted from figure) which is connected to an air supply device (omitted from figure), so that compressed air can be blown downwards inside air groove 160. Also, the air passage is provided with an opening and closing valve (omitted from figure), and the supply and blocking of air can be controlled by controlling solenoid (refer to FIG. 10) 162 of the opening and closing valve.

Also, on arm member 116, as shown in FIG. 5 to FIG. 7, as well as opening on the upper surface, groove 166 connected to vertical groove section 146 open the side surface of the front of case member 110 is formed. Groove 166 is bent towards first arm section 118 and extends to the end surface of first arm section 118. Pin 162 is established on the inside of groove 166 of the upstream side of that end surface, and electronic components indexed inside groove 166 are stopped by that pin 162. In other words, the location at which pin 162 is established is the supply position for electronic components of bulk feeder 100.

On arm member 116, as well as opening on the upper surface, also formed are two air grooves 168 and 170 connected to the bent portion of groove 166. The above air passage is also connected to these air grooves 168 and 170, so that compressed air is blown inside groove 166 towards the end surface of first arm section 118. Further, air groove 168 is connected to the end section of the upstream side of the bent portion of groove 166, and air groove 170 to the end section of the downstream side of the bent portion of groove 166. By this, electronic components indexed in groove 166 are not allowed to accumulate in the bent section.

Further, the upper surface of arm member 116 is covered by a cover (omitted from figure) and groove 166 and air grooves 168 and 170 are tunnel shaped. Also, a cutout section (omitted from figure) is formed in the position covering the supply position for electronic components of number 1 arm section 118, and supply of electronic components is performed via that cutout section. Further, the cover is formed from semi-transparent material so that groove 166 and air grooves 168 and 170 can be checked visually from outside.

Also, storage section 156 for storing electronic components, in other words, recess section 154 formed in case member 112, is open to the upper surface and lower surface of case member 112, and shutters 172 and 174 are provided on those openings respectively. Opening and closing is made possible by sliding each shutter 172 and 174, and by opening shutter 172 it is possible to replenish electronic components inside storage section 156, and by opening shutter 174 it is possible to evacuate electronic components stored in storage section 156 outside of bulk feeder 100.

With bulk feeder 100 configured as given above, electronic components are stored inside storage section 156 in a loose state, and those multiple electronic components stored in a loose state are indexed to a supply position while arranged in a single line. Specifically, electronic components housed in storage section 156 are taken into annular groove section 144 by the magnetic force of permanent magnets 140. Further, by rotating turntable 130 in the normal direction via the movement of rotation movement device 132, electronic components taken into annular groove section 144 are moved in the rotational direction of turntable 130. During this, multiple electronic components come to be arranged in a single line inside annular groove section 144.

When electronic components housed in annular groove section 144 reach the tunnel shaped annular groove section 144 in accordance with the rotation of turntable 130, electronic components which protrude from annular groove section 144 contact side wall 158 of recess section 154. By this, electronic components which contact side wall 158 drop to the bottom of storage section 156 and only electronic components which are appropriately housed in annular groove section 144 are moved inside annular groove section 144 in accordance with the rotation of turntable 130.

In accordance with the rotation of turntable 130, electronic components are moved from inside annular groove section 144 to inside vertical groove section 146. And, although electronic components move down by their own weight inside vertical groove section 146, they are indexed to groove 166 through the inside of vertical groove section 146 by air which is blown inside vertical groove section 146 from air groove 160.

Electronic components indexed to groove 166, are further indexed towards the end surface of first arm section 118 by air blown in groove 166 from air grooves 168 and 170 and contact pin 162 which is established in groove 166. By this, multiple electronic components housed in a loose state are indexed to the supply position while arranged in a single line.

As given above, with bulk feeder 100 it is possible to arrange multiple electronic components which were housed in a loose state in a single line by magnetic force, and to index those multiple arranged electronic components to a supply position by air pressure force. It is difficult to arrange multiple electronic components housed in a loose state into a single line inside a groove using air pressure, but it is possible to perform this relatively easily if magnetic force is used as given above. On the other hand, it is possible to perform indexing of multiple electronic components arranged in a single line inside a groove using magnetic force, but using air pressure makes it possible to index electronic components at a faster speed.

Also, if a bulk feeder is configured so that electronic components are indexed using only magnetic force without using air pressure, it is necessary to arrange the supply position on the rotation path of permanent magnets 140. On the other hand, if a bulk feeder is configured to index electronic components using air pressure, the supply position can be set relatively freely. In this way, with bulk feeder 100, by combining the appropriate advantages of magnetic force and air pressure respectively, it is possible to perform supply of electronic components ideally.

Figure 10:
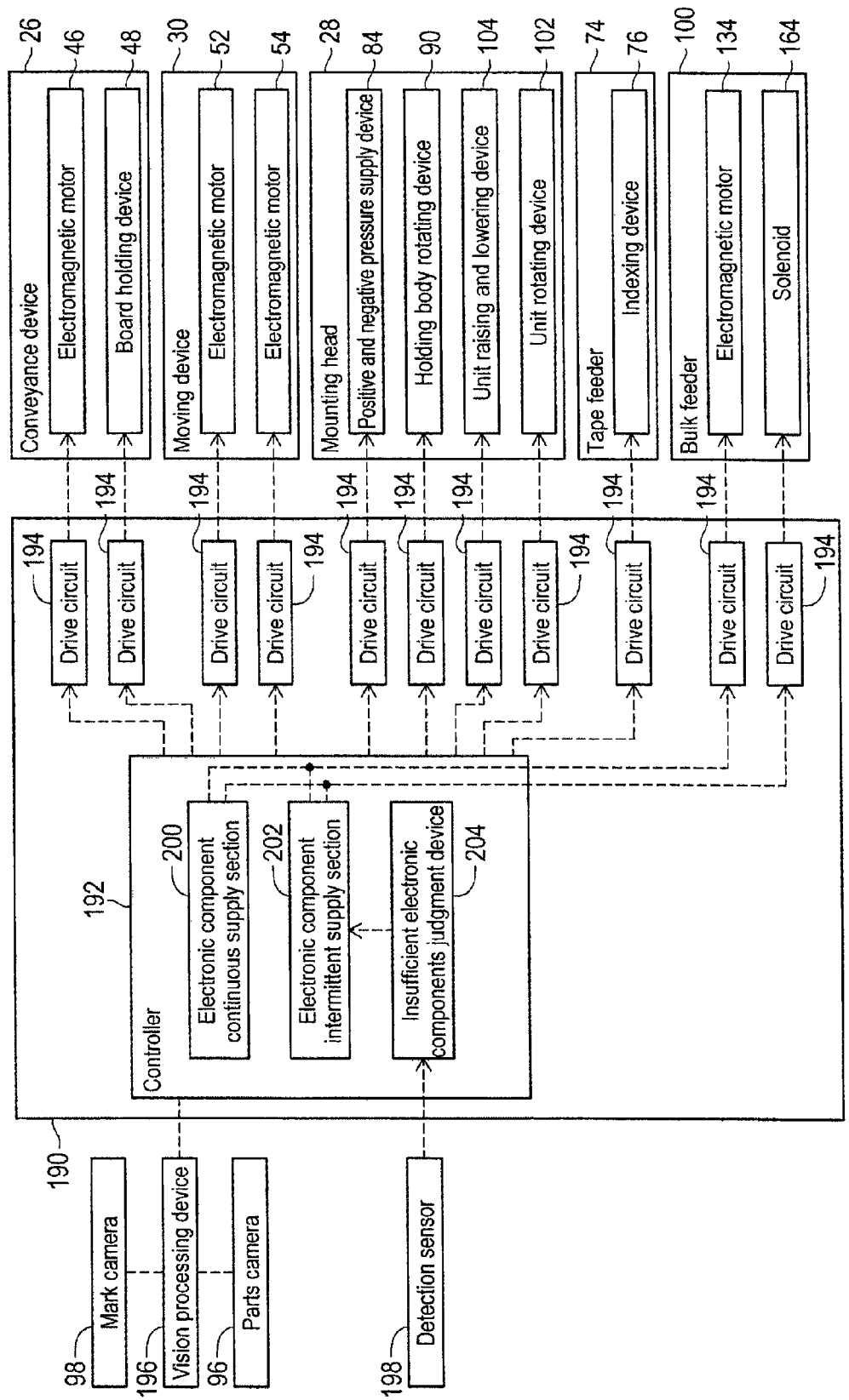
[FIG. 10] This is a block diagram showing the control device which is provided on the electronic component mounter machine.

Also, mounter module 16, as shown in FIG. 10, is equipped with control device 190. Control device 190 is equipped with controller 192 which is comprised mainly of a computer equipped with items such as CPU, ROM, and RAM; and multiple drive circuits 194 corresponding respectively to the above electromagnetic motors 46, 52, 54, and 134, board holding device 48, indexing device 76, positive and negative pressure supply device 84, holding body rotating device 90, unit rotating device 102, unit raising and lowering device 104, and solenoid 164. Also, the driving power for items such as the conveyance device and moving device are connected to controller 192 via each drive circuit 194, such that operation of items such as the conveyance device and moving device can be controlled.

Also, image processing device 196 for processing data of images acquired by parts camera 96 and mark camera 98 is connected to controller 192, so that various types of data can be acquired from the image data. Further, detection sensor 198 is connected to controller 192. Detection sensor 198 is provided at the supply position of bulk feeder 100 and is a sensor for detecting the presence of electronic components at the supply position.

Mounting operation by electronic component mounter machine

On mounter machine 10, it is possible to perform mounting operation of mounting electronic components on circuit boards by the configuration given above. A circuit board is first conveyed to the mounting operation position by conveyor devices 40 and 42 and then the circuit board is held fixedly in that position. Next, mounting head 28 is moved above the circuit board by moving device 30, and an image of the circuit board is captured by mark camera 98. From that image, the type of the circuit board and the holding position error of the circuit board due to conveyor devices 40 and 42 are acquired. Electronic components for that type of circuit board which was acquired are supplied by tape feeders 74 or bulk feeder 100. Further, those supplied electronic components are picked up and held by suction nozzles 80 of mounting head 28 at the mounting station or pickup station. However, in order to pick up and hold electronic components supplied by tape feeders 74, it is necessary to move mounting head 28 to the supply position of tape feeders 74 by moving device 30. Continuing, images of electronic components picked up and held by suction nozzles 80 are captured by parts camera 96 at the imaging station. From that image the holding position error of the electronic components is acquired. Further, mounting head 28 is moved to the mounting position above the circuit board by moving device 30, and the electronic components are mounted at the mounting station after suction nozzles 80 are rotated based on the error between the holding position of the electronic components and the circuit board.

Supply by Bulk Feeder

As given above, mounter machine 10 is configured to pick up and hold electronic components supplied by tape feeders 74 or bulk feeder 100 using suction nozzles 80, and to mount those picked up and held electronic components on a circuit board. On the present mounter machine 10, as given above, bulk feeder 100 is fixed to mounting head 28, and it is possible to supply electronic components to a pickup station. In other words, it is possible to sequentially pick up and hold electronic components from the supply position of bulk feeder 100 by multiple suction nozzles 80 by rotating unit holding body 86 without having to move mounting head 28 to the supply position by moving device 30. For this, with bulk feeder 100, electronic components are indexed sequentially to the supply position.

Indexing to the electronic component supply position by bulk feeder 100, as given above, is performed by relying on magnetic force and air pressure, and is performed by controlling the operation of solenoid 164 of the opening and closing valve which switches between supplying and blocking air and electromagnetic motor 134 of rotation movement device 132. Specifically, when electronic components are indexed to the supply position, the opening and closing valve is opened by the operation of solenoid 164 and compressed air is supplied inside grooves 146 and 166. Also, the operating state of solenoid 164 when the opening and closing valve is open can be referred to as on, and the operating state of solenoid 164 when the opening and closing valve is closed can be referred to as off.

Further, when electronic components are indexed to the supply position, solenoid 164 is switched from on to off Also, the judgment as to whether electronic components have been indexed to the supply position is performed by detection sensor 198. Next, when solenoid 164 is switched from on to off, electromagnetic motor 134 operates and electronic components are indexed inside grooves 146 and 166. By this, electronic components to replace the electronic components indexed are replenished in grooves 146 and 166. Also, the reason for operating electromagnetic motor 134 at the timing when solenoid 164 is switched from on to off is that while solenoid 164 is on, (i.e., while compressed air is being supplied inside grooves 146 and 166), indexing electronic components inside grooves 146 and 166 is difficult.

Next, when an electronic component indexed to the supply position is picked up and held by suction nozzle 80 and removed from the supply position, solenoid 164 is switched from off to on and the next electronic component is indexed to the supply position. In other words, when it is judged that there is no electronic component in the supply position by detection sensor 198, solenoid 164 is switched from off to on. Further, electromagnetic motor 134 is stopped at the timing when solenoid 164 is switched from off to on.

Figure 11:
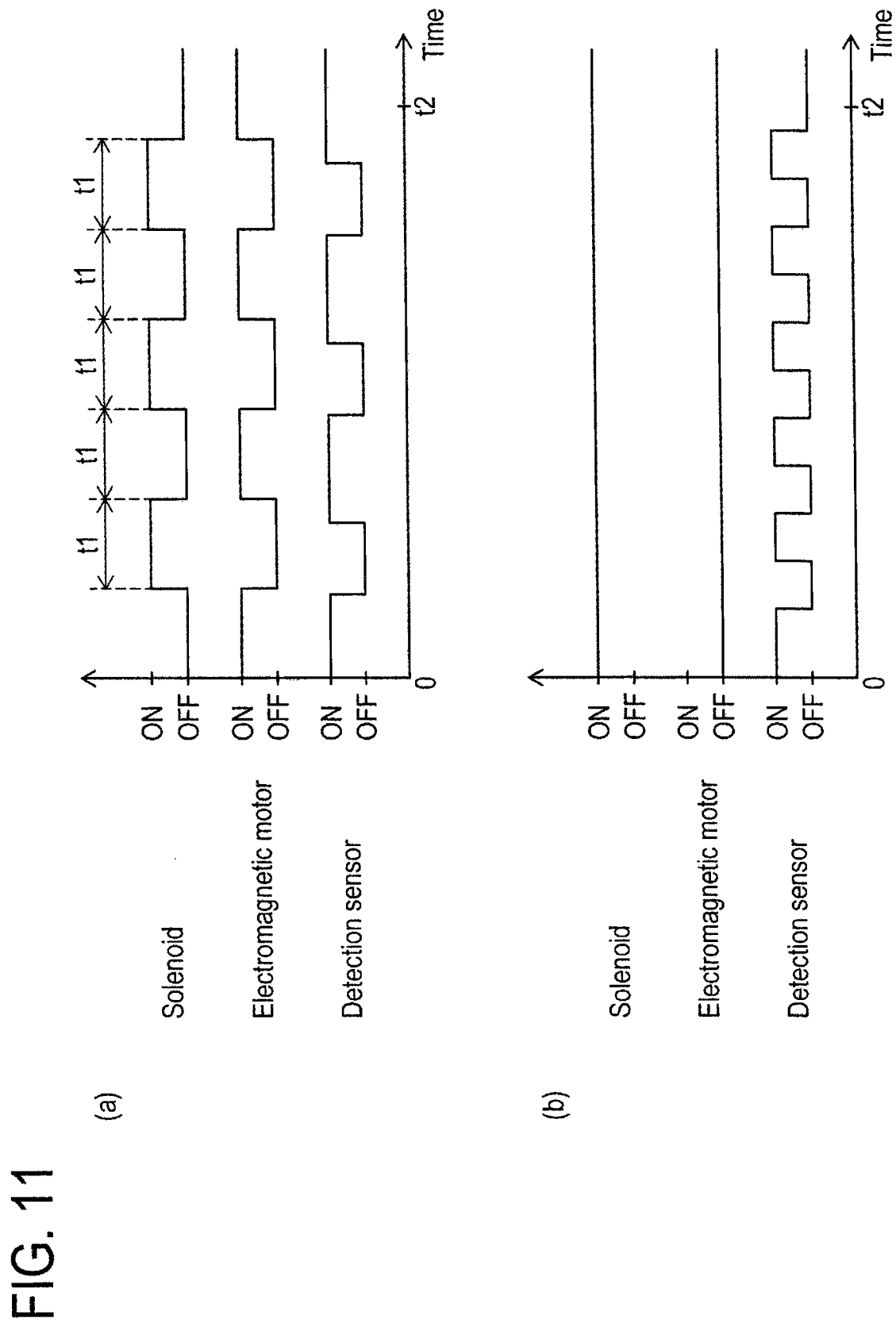
[FIG. 11] This is a chart showing conceptually the solenoid and electromagnetic motor operating states and the change as time elapses of the detection value from the detection sensor.

The above solenoid 164 and electromagnetic 134 operation, and the relationship of the detection values of detection sensor 198 are described using the chart shown in FIG. 11(*a*). Also, the "ON" of electromagnetic motor 134 in the figure indicates that electromagnetic motor 134 is operating, and the "OFF" indicates that electromagnetic motor 134 is stopped. Also, the "ON" of detection sensor 198 in the figure indicates that there is an electronic component in the supply position, and "OFF" indicates that there is not an electronic component in the supply position.

As can be understood from this figure, solenoid 164 switches intermittently between on and off, and electromagnetic motor 134 switches intermittently between operating and stopping with the opposite cycle to the cycle of solenoid 164. Also, solenoid 164 is switched from off to on at the timing when detection sensor 198 is switched from on to off. In other words, as given above, when it is judged that there is not a component in the supply position, solenoid 164 is switched from off to on. On the other hand, solenoid 164 is switched from on to off slightly delayed from the timing when detection sensor 198 is switched from off to on. This a functional issue of solenoid 164 and is caused by a limit to the switching speed of solenoid 164.

To describe in detail, there is a limit to the operation speed of solenoid 164, and although the time is short in order to switch from one to the other of the states on and off, a specific time (t1 for solenoid 164) is required. Due to this, solenoid 164 is switched from on to off slightly delayed from the timing when detection sensor 198 is switched from off to on. In this way, when electronic components are supplied by intermittently operating solenoid 164 and electromagnetic motor 134, as can be understood from the figure, during specified time t2, solenoid 164 is on three times, so that it is possible to supply three electronic components. Further, the control for solenoid 164 and electromagnetic motor 134 being intermittently operated and electronic components being intermittently supplied can be referred to as electronic component intermittent supply control.

With the above electronic component intermittent supply control (hereafter in some cases abbreviated to "intermittent supply control"), as given above, the quantity of electronic components which is supplied per unit time is limited based on the switching speed of solenoid 164. To take account of this, bulk feeder 100 is capable of operating solenoid 164 continuously and performing electronic component continuous supply control which supplies electronic components continuously.

Specifically, with electronic component continuous supply control (hereafter in some cases abbreviated to "continuous supply control"), solenoid 164 is kept on without being switched. In other words, compressed air is supplied continuously inside grooves 146 and 166, and an electronic component is indexed to the supply position immediately after an electronic component is removed from the supply position. Due to this, it is possible for the supply quantity of electronic components per unit time to be large. Further, because compressed air continues to be supplied inside grooves 146 and 166, with continuous supply control electromagnetic motor 134 is not operated.

Solenoid 164 and electromagnetic 134 operation during continuous supply control, and the relationship of the detection values of detection sensor 198 are described using the chart shown in FIG. 11(b). As can be understood from the figure, solenoid 164 is kept on, and electronic components inside grooves 146 and 166 are always biased towards the supply position. And, whenever an electronic component is removed from the supply position, a new electronic component is indexed to the supply position. Due to this, during specified time t2, detection sensor 198 is switched from off to on five times, so that it is possible to supply five electronic components.

Further, the supply quantity of electronic components per unit time with continuous supply control, is capable of being made even larger according to the abilities of mounting head 28. In other words, by increasing the operating speed of items such as holding body rotating device 90 and unit raising and lowering device 104 and shortening the time for consecutively picking up electronic components by multiple suction nozzles 80, the supply quantity of electronic components per unit time becomes larger.

With the above continuous supply control, it is possible to increase the supply quantity of electronic components per unit time and it is possible to perform mounting operation efficiently. However, with continuous supply control, electromagnetic motor 134 is not operated and electronic components are not replenished to grooves 146 or 166. Due to this, if only continuous supply control is performed, there is a concern about components running out in grooves 146 and 166 and electronic component supply stopping. Due to this, with bulk feeder 100, continuous supply control and intermittent supply control are performed selectively.

Specifically, because electronic components are mounted in various locations on a circuit board, the moving distance of the mounting head 28 between two consecutive mounting operation mounting positions, (i.e., the distance between the mounting position of one electronic component and the mounting position of the electronic component mounted next after that electronic component), differs for each mounting operation. Due to this, the time required to move mounting head 28 between two consecutive mounting operation mounting positions also differs, and the quantity of electronic components which should be supplied per unit time differs.

In light of this, with bulk feeder 100, if the moving distance of moving device 30 is short, continuous supply control is performed, and if the moving distance of moving device 30 is long, intermittent supply control is performed. In other words, if the time required to move mounting head 28 is short, the supply quantity of electronic components per unit time is increased, and if the time required to move mounting head 28 is long, that longer time is used to perform replenishment of electronic components inside grooves 146 and 166 while supplying electronic components. By this, as well performing mounting operation efficiently, it is possible to prevent an insufficiency of electronic components in grooves 146 and 166.

Also, for the above switching method between continuous supply control and intermittent supply control, when most of the mounting positions for two consecutive mounting operations are closely adjacent, the frequency of performing continuous supply control is increased, and there is a concern about an insufficiency of electronic components in grooves 146 and 166. Due to this, with bulk feeder 100, judgment is performed as to whether there are insufficient electronic components in grooves 146 and 166, and when it is judged that there are insufficient electronic components in grooves 146 and 166, intermittent supply control is performed.

The judgment as to whether there are insufficient components inside grooves 146 and 166 is performed using the detection value of detection sensor 198. In detail, when continuous supply control is being performed, usually, in order to index a new electronic component to the supply position immediately when an electronic component is removed from the supply position, the time to turn detection sensor 198 off is relatively short. Due to this, if a specified amount of time elapses for the time that detection sensor 198 is off, it is judged that there are insufficient electronic components in grooves 146 and 166, and intermittent supply control is performed. By this, it is possible to perform intermittent supply control appropriately when there is an insufficiency of electronic components.

Further, electronic component continuous supply section 200 (refer to FIG. 10) which is the functioning section for supplying electronic components using continuous supply control, electronic component intermittent supply section 202 (refer to FIG. 10) which is the functioning section for supplying electronic components using intermittent supply control, and insufficient electronic components judgment device 204 (refer to FIG. 10) which is the functioning section for judging whether there are insufficient electronic components in grooves 146 and 166, are provided on controller 192 of control device 190.

Also, when an insufficiency of electronic components in grooves 146 and 166 should be dealt with and intermittent supply control is being performed, mounting operation is performed of electronic components supplied by an electronic component supply device different to bulk feeder 100, in other words tape feeder 74. By this, it is possible to curtail the drop in productivity when the supply quantity of electronic components per unit time is lowered.

Further, for the example embodiment above, bulk feeder 100 is an example of a bulk feeder, and bulk feeder 100 comprising items turntable 130 and rotation movement device 132, storage section 156, groove 142 and groove 166, control device 190, air supply device and solenoid 164 are examples of a magnetic force dependent indexing device, storage section, supply passage, control device and air pressure dependent indexing device. Permanent magnets 140 of turntable 130 are an example of magnets. Annular groove section 144 is an example of a magnetic force dependent supply passage, and the item comprising vertical groove section 146 and groove 166 is an example of an air pressure dependent supply passage. Moving device 30 and detection sensor 198 are examples of a moving device and detection sensor. Electronic component mounter module 16 is an example of an electronic component mounter module and electronic component mounter module 16 comprising items tape feeder 74 and mounting head 28 are examples of an electronic component supply device and mounting head.

Further, the present invention is not limited to the above example embodiment, and various changed or improved methods of embodiment are possible based on the knowledge of someone skilled in the art. Specifically, for example, in the above embodiment electronic components were indexed to the supply position dependent on compressed air, in other words, positive pressure air, but it is also acceptable to index electronic components to the supply position by negative pressure air, in other words, by sucking air from grooves 146 and 166. In this case, a suction passage is connected to groove 166 which opens at the end of first arm section 118, and forming air grooves 160, 168 and 170 is not required.

Also, in the above embodiment the judgment of an insufficiency of electronic components in grooves 146 and 166 used detection sensor 198. However, it is also acceptable to judge an insufficiency of electronic components in grooves 146 and 166 by counting the quantity of electronic components supplied by continuous supply control. Specifically, the quantity of components which can be stored in grooves 146 and 166 is calculated in advance, and the quantity of electronic components supplied by continuous supply control is subtracted from that quantity. By this, it is possible to identify the quantity of electronic components remaining in grooves 146 and 166, which means it is easy to determine whether there are insufficient electronic components in grooves 146 and 166.

Also, when selectively performing continuous supply control and intermittent supply control in accordance with the moving distance of mounting head 28 by moving device 30, it is possible to perform mounting operation even more efficiently by setting the mounting order of multiple electronic components by taking into account of the quantity of electronic components which can be stored inside grooves 146 and 166. Specifically, for example, if the quantity of electronic components which can be stored in grooves 146 and 166 was 50, the mounting order of multiple electronic components is set so that intermittent supply control is performed before all 50 of the electronic components stored in grooves 146 and 166 are mounted, and so that the mounting positions of two consecutive mounting operations are apart from each other. By this, it is possible to replenish electronic components in grooves 146 and 166 before all the electronic components stored in grooves 146 and 166 are used, making it possible to maintain high productivity.

Symbol Descriptions

16: Electronic component mounter module; 28: Mounting head; 30: Moving device; 74: Tape feeder (electronic component supply device); 100: Bulk feeder; 130: Turntable (magnetic force dependent indexing device); 132: Rotation movement device (magnetic force dependent indexing device); 140: Permanent magnet (magnet); 142: Groove (supply passage); 144: Annular groove section (magnetic force dependent supply passage); 146: Vertical groove section (air pressure dependent supply passage); 156: Storage section; 164: Solenoid (air pressure dependent indexing device); 166: Groove (supply passage) (air pressure dependent supply passage); 190: Control device; 198: Detection sensor.

What is claimed is:

1. A bulk feeder comprising:
    a housing including a case member which is a plate;
    a storage section for storing multiple electronic components in a loose state; and
    a supply passage for guiding the electronic components stored in the storage section to an electronic component supply position while arranged in a single line which supplies electronic components to the supply position,
    wherein the supply passage, as well as arranging electronic components stored in the storage section in a single line by relying on magnetic force, includes a magnetic force dependent supply passage for indexing from the storage section, and an air pressure dependent supply passage connected to the magnetic force dependent supply passage for indexing electronic components indexed from the magnetic force dependent supply passage to the supply position by relying on positive pressure or negative pressure air,
    wherein the magnetic force dependent supply passage is formed in a fitting surface of the case member,
    wherein the bulk feeder further comprises a magnetic force dependent indexing device which uses a magnet and by movement of that magnet indexes electronic components from the storage section to the air pressure dependent supply passage via the magnetic force dependent supply passage, and
    wherein the magnetic force dependent indexing device is a turntable which is disc shaped and rotatable around a center axis thereof, the magnetic force dependent indexing device is provided in a recess section formed in the case member, and the recess section opens in a surface of the case member on a side opposite to the fitting surface of the case member.

2. The bulk feeder according to claim 1, further comprising:
    an air pressure dependent indexing device connected to the air pressure dependent supply passage and which indexes electronic components to the supply position by supplying positive pressure or negative pressure air to the air pressure dependent supply passage; and
    a control device for controlling the magnetic force dependent indexing device and air pressure dependent indexing device,
    wherein the control device can selectively perform electronic component intermittent supply control in which electronic components are indexed to the supply position by operating the magnetic force dependent indexing device while intermittently operating the air pressure dependent indexing device, and electronic component continuous supply control in which electronic components are indexed to the supply position by continuous operating the air pressure dependent indexing device without operating the magnetic force dependent indexing device.

3. The bulk feeder according to claim 2, fixedly connected to a mounting head for mounting electronic components supplied by the bulk feeder to a circuit board, and configured to be moved by a moving device to any position above a base together with the mounting head, wherein the control device can selectively perform the electronic component intermittent supply control and the electronic component continuous supply control in accordance with a movement distance of the moving device.

4. The hulk feeder according to claim 3, wherein the control device performs the electronic component intermittent supply control when it is assumed based on an assumption that there are insufficient electronic components in the air pressure dependent supply passage.

5. The bulk feeder according to claim 4, further comprising a detection sensor for detecting a presence of electronic components equipped on the air pressure dependent supply passage,
- wherein the control device, based on a detection value of the detection sensor, performs the electronic component intermittent supply control when it is assumed based on an assumption that there are insufficient electronic components in the air pressure dependent supply passage.

6. The bulk feeder according to claim 4, wherein the control device, based on a quantity of electronic components which are capable of being stored in the air pressure dependent supply passage and a quantity of electronic components being supplied by the electronic component continuous supply control, performs the electronic component intermittent supply control when it is assumed based on an assumption that there are insufficient electronic components in the air pressure dependent supply passage.

7. An electronic component mounter module comprising:
the bulk feeder according to claim 1;
an electronic component supply device different than the bulk feeder; and
a mounting head for mounting electronic components supplied by the bulk feeder or the electronic component supply device to a circuit board;
wherein the mounting head mounts on a circuit board electronic components supplied by the electronic component supply device while electronic component intermittent supply control is being performed.

8. The bulk feeder according to claim 1, wherein the housing includes first and second case members which are fitted together via respective fitting surfaces, each of the first and second case members being a plate, and
- wherein a portion of the supply passage is formed in the fitting surface of the first case member, and the storage section is formed in the fitting surface of the second case member.

9. The bulk feeder according to claim 1, further comprising an arm member secured to a bottom end of the housing,
- wherein a portion of the air pressure dependent supply passage is formed in the arm member.

10. The bulk feeder according to claim 1, wherein the magnetic force dependent supply passage is formed along a rotation path of the magnet on the magnetic force dependent indexing device.

\* \* \* \* \*